United States Patent [19]
Elkins et al.

[11] Patent Number: 4,676,867
[45] Date of Patent: Jun. 30, 1987

[54] PLANARIZATION PROCESS FOR DOUBLE METAL MOS USING SPIN-ON GLASS AS A SACRIFICIAL LAYER

[75] Inventors: Patricia C. Elkins, Long Beach; Yau-Wai D. Chan, Fullerton; Keh-Fei C. Chi, Garden Grove; Karen A. Reinhardt, Tustin; Rebecca Y. Tang, Anaheim; Robert L. Zwingman, Walnut, all of Calif.

[73] Assignee: Rockwell International Corporation, El Segundo, Calif.

[21] Appl. No.: 871,655

[22] Filed: Jun. 6, 1986

[51] Int. Cl.$^4$ .............. B44C 1/22; C03C 15/00; C03C 25/06; C23F 1/02
[52] U.S. Cl. ............... 156/643; 29/576 W; 29/578; 29/591; 156/644; 156/646; 156/653; 156/657; 156/663; 427/38; 427/90; 427/93
[58] Field of Search ............. 252/79.1; 156/643, 644, 156/646, 652, 653, 655, 656, 657, 662, 663; 204/192 EC, 192 E; 427/38, 39, 89, 90, 93; 29/571, 576 W, 577, 578, 591

[56] References Cited

U.S. PATENT DOCUMENTS

| | | | |
|---|---|---|---|
| 4,470,874 | 9/1984 | Bartush et al. | 156/643 |
| 4,492,717 | 1/1985 | Pliskin et al. | 427/96 |
| 4,523,975 | 6/1985 | Groves et al. | 156/643 |
| 4,545,852 | 10/1985 | Barton | 156/643 |
| 4,576,900 | 3/1986 | Chiang | 430/313 |

OTHER PUBLICATIONS

Allied Chemicals Preliminary Information Bulletin, "ACCUGLASS TM 204 Spin-On Glass", Mar. 1985, pp. 1-3.
Allied Chemicals Product Safety Data Sheets, "ACCUGLASS TM M3R, M3RP, 103, 204", pp. 1-4.
Allied Chemicals Product Safety Data Sheet, "ACCUGLASS® Product Safety Data Sheet", 4 pages.

Primary Examiner—William A. Powell
Attorney, Agent, or Firm—H. Fredrick Hamann; George A. Montanye; David J. Arthur

[57] ABSTRACT

A method of providing a planar or iso-planar surface to the interlevel dielectric layer between metal layers of a multilevel MOS wafer includes applying a first dielectric over the first metal layer, applying a layer of spin-on glass over the first dielectric layer, etching the spin-on glass layer in an etch process in which the rate of etch of the spin-on glass is approximately the same as the rate of etch of the first dielectric to reveal at least a portion of the first dielectric layer. A second dielectric layer is placed over the surface of the first dielectric. Vias may then be defined through the dielectric layers, and the second metal layer may be applied over the relatively smooth surface of the second dielectric layer.

17 Claims, 5 Drawing Figures

PLANARIZATION PROCESS FOR DOUBLE METAL MOS USING SPIN-ON GLASS AS A SACRIFICIAL LAYER

BACKGROUND OF THE INVENTION

As integrated circuit density and complexity increase, the need to reduce dimensions is paramount in achieving performance and yield goals. Multi-level metallization and overall design shrink become key to achieving the packing density necessary for VLSI and beyond.

One manufacturing requirement associated with multi-level metallization is topographical planarization. A relatively smooth planar or iso-planar surface is important for increasing metallization step coverage yields, and in feature size control. Additionally, the need for compatibility with the underlying aluminum alloy interconnect precludes any high temperature glass flow step in such planarizations.

In the process of forming a semiconductor wafer having two or more metal layers, a structure is produced prior to defining vias and depositing the second metal layer that comprises various layers of oxide, polysilicon conductors, and first metal conductors, all covered with a first interlevel dielectric (ILD1). Because the surface of the underlying structure is quite irregular, the surface of the interlevel dielectric ILD1 also is very irregular. If a second metal layer is applied directly on top of this interlevel dielectric, the sharp edges and crevices that tend to exist on the surface of the dielectric cause cracks in the second metal layer and result in incomplete metal coverage over the steps in the dielectric surface. Such defects reduce device yields.

A problem in double metal processes therefore has been to obtain a topographically planar or iso-planar surface prior to via definition and second metal deposition. Numerous methods have been attempted and used in the industry for such planarization of the interlevel dielectric.

One planarization method commonly used is to use a layer of photoresist material as a sacrificial layer. In this method, a layer of photoresist is applied over the interlevel dielectric. The photoresist is then etched back until the portions of the interlevel dielectric through which the vias are to be defined are revealed.

Problems have arisen in using a photoresist as a sacrificial layer because of the differences between the etch characteristics of the photoresist and the interlevel dielectric material. Because the photoresist is a polymer and the interlevel dielectric is typically a glass, during the etch-back process, the polymer photoresist tends to etch at a different rate than the interlevel dielectric, resulting in a less than ideally planar surface. Additionally, the etch material used is a plasma etcher, which causes the photoresist to polymerize further, coating the etching chamber with a polymer, and changing the etch characteristics of the polymer itself to provide a barrier to further etching, occasionally even halting the etching process altogether.

Other methods of planarization that have been attempted include surface leveling by RF sputter etching, and planarization using spun-on polyimide films.

SUMMARY OF THE INVENTION

The present invention comprises a method of obtaining a topographically planar or iso-planar surface of dielectric over a first metal layer prior to via definition and second metal deposition.

The method of the invention includes applying a first layer of dielectric over the first metal layer, applying a layer of spin-on glass over the first dielectric layer, etching the spin-on glass layer to reveal at least a portion of the first dielectric layer, and applying a second layer of dielectric over the first dielectric layer.

The spin-on glass applied is preferably a siloxane. After application of the slioxane spin-on glass, the glass is cured to substantially convert the siloxane to silicon dioxide. The etch process is controlled so the rate of etch of the spin-on glass is substantially the same as the rate of etch of the first dielectric. The etch process preferably removes all of the spin-on glass from the areas through which vias are to be defined.

DETAILED DESCRIPTION OF THE PREFERRED EMBODIMENT

Figure 1:
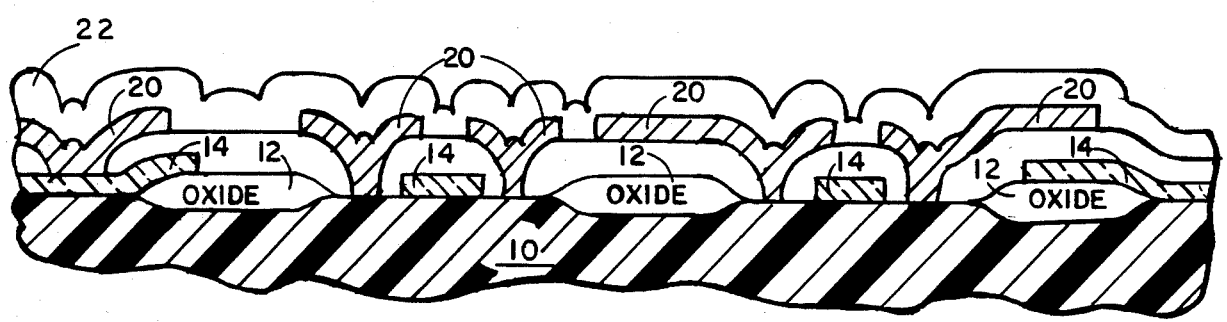
FIG. 1 is a cross-sectional view of a wafer surface following application of a first interlevel dielectric, prior to via definition and second metal deposition.

A typical CMOS semiconductor wafer surface structure up through the first metal conductor layer and the interlevel dielectric layer is shown in FIG. 1. The specific structure shown is exemplary only, as numerous different structures are encountered in various portions of a typical wafer surface. The wafer typically includes a silicon substrate 10, with layers of oxide 12, polysilicon conductor 14, and other materials applied over the substrate as in known in the art.

First Metal Layer

The first metal layer typically consists of conductors 20 formed of an aluminum silicon copper (Al-Si-Cu) alloy that is deposited and then etched using RIE to obtain a near anisotropic straight-wall profile.

It has been observed that the size and densities of first metal hillocks are a dominant factor in causing short circuits between the first and second metal layers of a device having multiple metal layers. Therefore, it is preferred that an aluminum-silicon-copper alloy is used for the first metal layer rather than an aluminum-silicon alloy, which effectively doubles the metal 2 to metal 1 capacitor breakdown yields. It is calculated that the defect density is improved by an order of magnitude over that obtained when the first metal layer is an aluminum silicon alloy. The use of such an aluminum-silicon-copper alloy for the first metal layer to reduce hillocks is known in the art.

First Interlevel Dielectric Layer (ILD1)

A first dielectric layer (ILD1) 22 is applied over the metal conductors 20. This dielectric is preferably a thin film of four percent or less (by weight) phosphorous-doped glass (PSG). The dielectric is preferably deposited using a conventional plasma enhanced chemical vapor deposition (PECVD) process. The ILD1 layer 22 is thus P-doped CVD $S_iO_2$, a doped plasma oxide.

The phosphorous-doped glass is preferably deposited using an ASM PECVD cantilever loaded system. Silane, phosphine, and nitrous oxide are preferred as the reactant gases. The process pressure is preferably 1.25 torr and process temperature is preferably 300° C. The PECVD system is preferably operated under limited depletion mode (LDM) at 1.3 KWatt of power. The PECVD oxide is deposited at a deposition rate of approximately 150 Angstroms per minute. A preferred thickness of the dielectric layer 22 is approximately 7000 Angstroms.

As seen in FIG. 1, the surface of the first dielectric layer ILD1 is quite irregular, following the contour of the underlying structure of a first metal layer 20. If the second metal layer is deposited on this ILD1 surface, the metal will tend to crack at the sharp crevices in the surface and may not fully cover the dielectric surface over the steps in the surface.

Spin-On-Glass (SOG)

Figure 2:
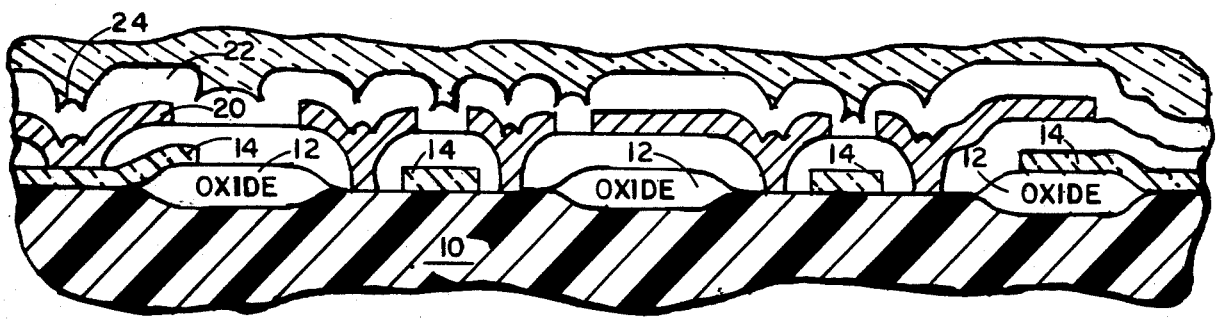
FIG. 2 is a cross-sectional view of the wafer surface following application of a layer of spin-on glass.

A coat or layer of undoped spin-on glass (SOG) 24 is then applied over the surface of the first dielectric layer 22. This spin-on glass film fills the gaps and identations in the underlying topography. Typical as-spun thickness is 3,000 Angstroms. The wafer surface with the added spin-on glass layer is shown in FIG. 2. The application process allows a relatively smooth surface to be formed.

The spin-on glass is preferably an organic siloxane spin-on glass, such as that marketed by Allied Chemical Corporation of Morristown, N.J. under the trademark "Accuglass", Type 204.

That SOG is a solution of a silicon-oxygen backbone polymeric material in an alcohol solvent system. More specifically, it is a phenylsiloxane polymer in alcoholic solvents, with the chemical formula:

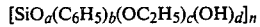

in which
a≧1
b≦0.5
c≦0.5
d≦0.5
5≦n≦100
and $C_6H_5$ is the phenyl.

Other spin-on glass formulations may be used for the SOG layer. A formulation should be selected that will provide a minimum number of bubbles in the applied layer, and a minimum of particulate buildup.

Approximately 2 milliliters of the SOG solution is dispensed on a four inch wafer. During application of the SOG the spin speed of the wafer is preferably controlled at approximately 3,000 RPM, to deliver a spin-on glass thickness of approximately 3,200 Angstroms, +/−3 percent.

Particulate buildup can be a problem during application of the SOG coat. The particle count should be kept to less than 10 of size 1 μm or larger per wafer per spin operation. Special track design with cup and nozzle rinse are beneficial to keep the process clean. The apparatus necessary to minimize particulate buildup during the application of SOG is readily available from suppliers such as Semiconductor Systems Incorporated of San Jose, Calif., and Machine Technology, also of San Jose, Calif.

Allied Chemical's Accuglass Type 204 has been successful in reducing particulate buildup because of its relatively slower solvent vaporization rate. This slower solvent vaporization rate is beneficial in reducing the number of particulates that are formed primarily as a result of solvent vaporization.

Following application of the SOG, the SOG is cured to convert it from organic siloxane to inorganic silicon dioxide ($SiO_2$). Manufacturers of the SOG typically specify a cure process that is intended to fully convert the applied material to inorganic SOG. For the preferred Allied Chemical Accuglass Type 204, the manufacturer recommends a one hour cure in an oven furnace or on a hot plate at 400° C. in an ambient atmosphere of air or a mixture of nitrogen ($N_2$) and oxygen ($O_2$). If the temperature in the curing process is not ramped up, the manufacturer recommends prebaking at 90°-100° C. for ten minutes in air. Nevertheless, for the organic siloxane Accuglass Type 204 SOG, an abbreviated curing process has been found to provide acceptable results for the process of the invention. This abbreviated curing is conducted by placing the wafer on a hot plate and baking it at 150°-300° C. for approximately one minute or longer immediately following the spin. This brief baking can be conducted in air. This abbreviated curing process provides adequate conversion for the subsequent etch-back step, while allowing greater wafer production through-put.

The baking or curing process affects the subsequent etch-back process, the importance of which is described below. A higher temperature in the baking or curing step leads to a lower carbon content in the cured SOG, which in turn results in a faster etch rate for the SOG. For reasons that are explained below, the etch rate of the cured SOG should closely match the etch rate of the interlevel dielectric layer. Therefore, the exact specifications of the bake or cure step may need to be adjusted to produce an SOG layer with the correct carbon content and etch rate.

A relatively high carbon content in the cured SOG is generally desirable to obtain an SOG that does not etch substantially faster than the underlying dielectric. The prefered Accuglas Type 204 organic siloxane, following the preferred abbreviated hot plate cure, at 150° C. for one minute, has a carbon content of approximately six percent. Abbreviated hot plate cures at temperatures up to about 300° C. have been successfully demonstrated.

Etch-Back

Figure 3:
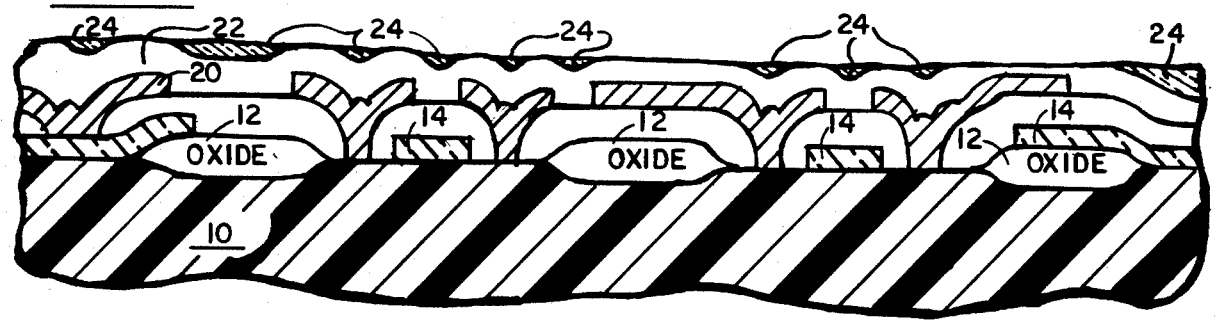
FIG. 3 is a cross-sectional view of the wafer surface following etching of the spin-on glass layer.

The wafer surface is next subjected to a plasma etch back process. The etch process should be selected to match as closely as possible the etch rate of the spun-on glass 24 and the first dielectric layer 22. With a matched etch rate the planar or iso-planar surface of the SOG layer 24 is maintained as the SOG and a portion of the first dielectric are etched away. Ideally, the etch rate of the SOG 24 and the PECVD oxide dielectric 22 should have a ratio (selectively) of 1.0:1.0. Nevertheless, a selectivity in the range of 0.8-1.3:1.0 provides acceptable results. The wafer surface after etch back is shown in FIG. 3.

A plasma etcher is preferably used to achieve a 1:1 SOG to PECVD oxide etch rate selectivity. A Tegal brand model 803 plasma etcher has been used with satisfactory results. The etching is preferably performed using Freon 116 ($C_2F_6$). The Freon 116 disassociates during the etching process, and the active fluorine reacts with the SOG or dielectric to provide the etching.

The Freon 116 is preferably mixed with helium to control the temperature during the etching process, and has oxygen added as a polymer inhibitor to control the etch rate ratio or selectivity.

The preferred ratio of helium to Freon is 2:1. Sufficient oxygen is added to the gas to provide as close as possible to a 1:1 selectivity in the etch rate ratio between the SOG and the dielectric. Preferably, the ratio of helium and Freon 116 to oxygen is approximately 30:1, so that oxygen forms approximately 3-5% of the total gas flow during etch. The etch is preferably conducted under a pressure of 2.5 torr, with power applied at 200 watts.

A 1:1 etch rate selectivity for the SOG to the phosphorous- doped PECVD oxide causes the relatively planar topography of the SOG surface as applied to be maintained. In general, SOG films etch faster than PECVD oxides. Nevertheless, the PECVD and SOG applied and the etch process used may be adequately controlled to achieve repeatable etch rate selectivities of 0.8-1.3:1.0 (SOG:ILD1). The initial, highly irregular surface of the interlevel dielectric layer will be replicated if the SOG etches at a substantially faster rate than the PECVD.

As discussed above, the carbon content of the cured SOG affects the etch rate of the SOG, with a higher carbon content resulting in a slower etch rate. Generally, using a higher temperature in the curing step provides a lower carbon content. A one-minute 150° C. hot plate cure has been found to provide acceptable results with an applied organic siloxane such as Allied Chemical's Accuglass Type 204. One minute hot plate cure at temperatures up to approximately 300° C. have also been successfully used.

The phosphorous concentration of the underlying PECVD dielectric affects its etch rate. Thus, the etch rate selectivity may also be controlled by adjusting the PECVD phosphorous concentration. As described above, the preferred phosphorous concentration for the PECVD oxide is 4% by weight.

Finally, the etch rate selectivity can be controlled with the etch process itself. As previously noted, oxygen added to the Freon 116 and helium acts as a polymer inhibitor to control the etch rates. Using a mixture of approximately 3-5% oxygen provides acceptable results.

The SOG and the interlevel dielectric are both oxides. Because only oxide is etched during the etch-back step, there is no loading effect or bullseye etch pattern typical of etch back processes using sacrificial layers consisting of a material different from the interlevel dielectric.

The degree of planarity achieved is controlled by the amount of SOG and plasma oxide removed during etch back. As with all spun-on materials, the thickness of the SOG layer is dependent on the underlying topography. Generally, following cure the greatest thickness of SOG appears atop wide metal bus lines and probe pads, while isolated minimum geometry lines have the smallest step height change. Etch back can range from complete removal of the SOG and a few thousand Angstroms of the interlevel dielectric, to removal of only the top thousand or so Angstroms of SOG. The exact amount is determined by overall yield results, and must be determined experimentally for each structure.

It is particularly advantageous to remove all of the SOG from the via area to help achieve high chain via chain yields. The difference in thermal expansion between the SOG and the plasma oxide may cause the top interlevel dielectric layer (applied as described below) to peel away from the underlying SOG, which results in a breakdown in the connection between the second metal layer and the first metal layer at the dielectric separation. Such a breakdown necessitates the removal of all of the SOG by a controlled planarization etch.

Small pockets of SOG remain filling the deepest valleys that had existed in the surface of the first interlevel dielectric, while etching away the highest portions of the interlevel dielectric. Thus, as shown in FIG. 3, the majority of the exposed surface area is that of the interlevel dielectric, but that pockets in that dielectric surface are filled with the SOG to yield a substantially planar surface.

Second Interlevel Dielectric (ILD2)

Figure 4:
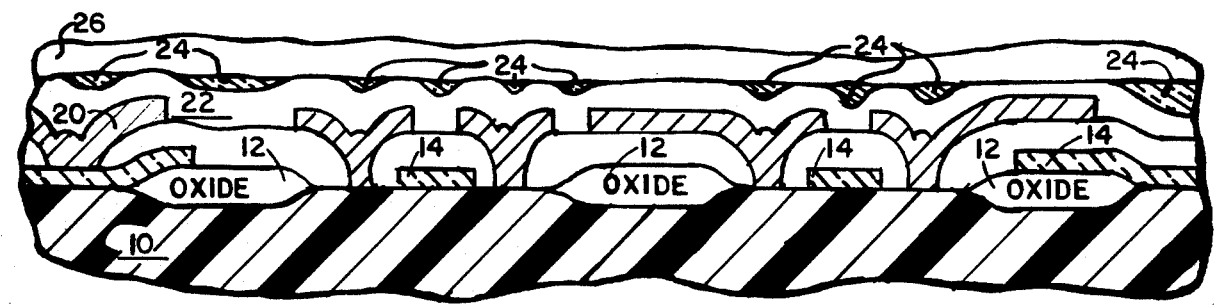
FIG. 4 is a cross-sectional view of the wafer surface following deposition of the second dielectric layer.

Following the etch back step, the total thickness of the remaining first interlevel dielectric 22 is generally too small to provide adequate insulation between metal layers if the second metal layer is applied directly on the etched surface. Therefore, as shown in FIG. 4, a second layer of interlevel dielectric (ILD2) 26 is applied over the surface of the first interlevel dielectric, as etched, with the surface pockets filled with the SOG. This second interlevel dielectric 26 is preferably the same material as the first interlevel dielectric, and preferably a film of approximately four percent or less phosphorous doped glass. This second interlevel dielectric is preferably applied in the same way as the first dielectric to a thickness of approximately 3,000-5,000 Angstroms. The total dielectric thickness between the two metal layers is about 10,000 Angstroms.

It is preferable that a relatively small area of the surface to which the second interlevel dielectric is applied is the spin-on glass filler material 24. It has been found that while adhesion between the two interlevel dielectric phosphorous doped glass layers 22, 26 is relatively good, the adhesion between the second layer of dielectric 26 and the spin-on glass 24 is relatively poor. Therefore, particularly in the areas in which the vias are to be placed, the second interlevel dielectric 26 should be applied directly to the first interlevel dielectric 22, with no SOG between them. The difference in thermal expansion between the SOG and the plasma oxide phosphorous-doped glass of the second dielectric layer may cause the second dielectric layer to peel away from the spin-on glass at the via edge or wall, which may cause a breakdown in the connection between the second metal layer and the first metal layer through the via.

Because the surface of the first dielectric and the spin-on glass on which the second dielectric is applied is relatively planar, the surface of the second dielectric is also relatively planar, ready for via definition and second metal layer deposition.

Via Definition and Second Metal Layer

Figure 5:
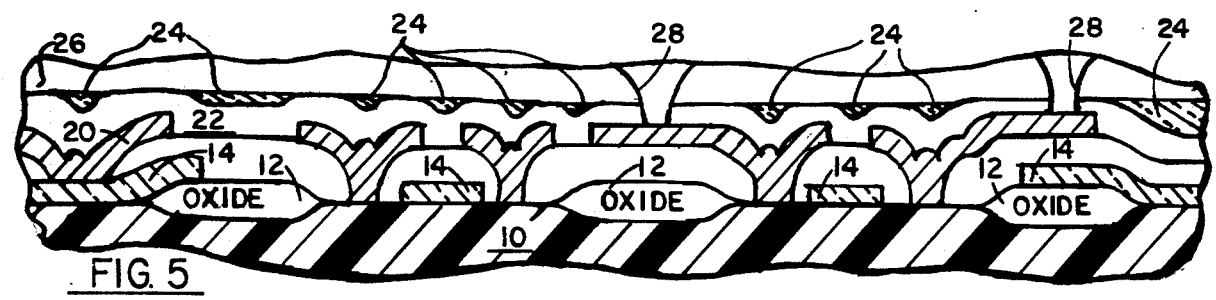
FIG. 5 is a cross-sectional view of the wafer surface following via definition, and prior to the second metal deposition.

Once the second dielectric layer 26 has been applied, leaving a smooth surface, vias or openings 28 may be formed through the dielectric layers to allow connections between the first and second metal layers. FIG. 5 shows the structure of FIG. 4 with the vias defined through the first and second dielectric layers, providing openings to the first metal conductors 20.

The second metal layer may be deposited on the surface of the second dielectric. As that surface is relatively smooth, the metal can be applied evenly and does not tend to crack. Connections of metal between the two metal layers are made though the vias or openings 28 through the dielectric layers ILD1 and ILD2 22, 26. As the two dielectric layers adhere well to each other, no splits occur along the via wall to cause discontinuities in the metal connection. These and the remaining steps of the fabrication process can be conducted as known by those skilled in the art without failure of the second metal layer due to an irregular dielectric surface.

We claim:

1. In a method of fabricating a semiconductor wafer, a method of obtaining a topographically planar or isoplanar surface comprising:
    applying a first layer of dielectric material over a first metal layer:
    applying a layer of spin-on glass over said first dielectric layer;
    etching said spin-on glass layer to reveal at least a portion of said first dielectric layer; and
    applying a second layer of dielectric over said first layer of dielectric.

2. The method of claim 1 wherein said spin-on glass is etched to reveal said first layer at least over a portion of a metal conductor.

3. The method of claim 2 wherein said spin-on glass is etched to reveal said first dielectric layer at least in the areas in which vias are to be defined.

4. The method of claim 1 additionally comprising, prior to said etching step, curing said spin-on glass.

5. The method of claim 4 wherein the rate of etch of said spin-on glass is substantially the same as the rate of etch of said first dielectric layer.

6. The method of claim 5 wherein the rate of etch of said spin-on glass is within the range of 0.8 to 1.3 times the rate of etch of said first dielectric.

7. The method of claim 6 wherein said curing step comprises baking said wafer for at least one minute at a temperature of at least 150° C.

8. The method of claim 4 wherein said etching step comprises plasma etching with $C_2F_6$ in a ratio of approximately 1:2 with helium, and having sufficient oxygen added to cause the said spin-on glass to be etched at approximately the same rate as said first dielectric.

9. The method of claim 8 wherein the ratio of helium (He) and $C_2F_6$ to oxygen ($O_2$) is approximately thirty to one.

10. The method of claim 8 wherein:
    said step of applying a first layer of dielectric material comprises depositing, using a plasma enhanced chemical vapor deposition process, a phosphorous doped oxide having a phosphorous content of no more than approximately four percent by weight;
    said step of applying a layer of spin-on glass comprises applying an organic siloxane;
    said step of curing said spin-on glass comprises baking said wafer for at least one minute at a temperature of at least 150° C.

11. The method of claim 8 wherein said oxygen makes up approximately five percent of the total etch process gas flow.

12. In a method of fabricating a semiconductor wafer having multiple levels of metallization, a method of providing an interlevel dielectric layer having a substantially planar surface, comprising:
    depositing, using a plasma enhanced chemical vapor deposition process, a first dielectric layer of phosphorous-doped glass over a first metal layer;
    applying a layer of undoped siloxane spin-on glass over said first dielectric layer;
    curing said spin-on glass to substantially convert it to silicon dioxide;
    etching away at least a portion of said spin-on glass and a portion of said first dielectric layer in an etch process in which the rate of etch of said spin-on glass is approximately the same as the rate of etch of said phosphorous-doped glass; and
    depositing, using the plasma enhanced chemical vapor deposition process, a second dielectric layer of phosphorous-doped glass over the remainder of said first dielectric layer and said spin-in glass.

13. The method of claim 12 wherein said curing step comprises placing said wafer on a hot plate at a temperature of approximately 150° C. for approximately one minute.

14. The method of claim 13 wherein said phosphorous-doped glass has a phosphorous content less than or equal to four percent by weight.

15. The method of claim 14 wherein said etching step comprises plasma etching with $C_2F_6$ in a ratio of approximately 1:2 with helium, and with a concentration of 3–5 percent oxygen.

16. In a method of fabricating a semiconductor wafer having multiple levels of metallization, a method of providing an interlevel dielectric layer having a substantially planar surface, comprising:
    depositing, using a plasma, enhanced chemical vapor deposition process, a first dielectric layer of phosphorous-doped glass over a first metal layer;
    applying a layer of undoped organic siloxane spin-on glass over said first dielectric layer;
    curing said spin-on glass to substantially convert it to silicon dioxide;
    etching away at least a portion of said spin-on glass and a portion of said first dielectric layer in an etch process in which the rate of etch of said spin-on glass is approximately the same as the rate of etch of said phosphorous-doped glass until all of said spin-on glass is removed from the areas in which vias are to be defined; and
    depositing, using the plasma enhanced chemical vapor deposition process, a second dielectric layer of phosphorous-doped glass over the remainder of said first dielectric layer and any remainder of said spin-in glass.

17. In a method of fabricating a semiconductor wafer having multiple levels of metallization, a method of providing an interlevel dielectric layer having a substantially planar surface, comprising:
    depositing, using a plasma enhanced chemical vapor deposition process, a first dielectric layer of phosphorous-doped glass over a first metal layer, said phosphorous-doped glass having a phosphorous concentration of no more than four percent by weight;
    applying a layer of undoped siloxane spin-on glass over said first dielectric layer;
    curing said spin-on glass by baking it for at least one minute at a temperature of at least 150° C.;
    etching away at least a portion of said spin-on glass and a portion of said first dielectric layer in a plasma etch process in which the plasma comprises a 1:2 ratio of $C_2F_6$ to helium, and approximately 3–5 percent oxygen so that the rate of etch of of said spin-on glass is approximately the same as the rate of etch of said phosphorous-doped glass until all of said spin-on glass is removed from the areas in which vias are to be defined to permit connection between said first metal layer and a subsequent metal layer; and
    depositing, using the plasma enhanced chemical vapor deposition process, a second dielectric layer of phosphorous-doped glass over the remainder of said first dielectric layer and said spin-in glass, said phosphorous doped glass having a phosphorous concentration of no more than four percent by weight.

* * * * *